(12) United States Patent
Mueller et al.

(10) Patent No.: US 8,136,372 B2
(45) Date of Patent: Mar. 20, 2012

(54) FUSED SILICA ARTICLE LOADED WITH DEUTERIUM AND METHOD OF MAKING

(75) Inventors: Michael A Mueller, Roth-Eckersmuehlen (DE); Michael Thomas Murtagh, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/106,165

(22) Filed: May 12, 2011

(65) Prior Publication Data
US 2011/0209503 A1 Sep. 1, 2011

Related U.S. Application Data

(62) Division of application No. 12/139,853, filed on Jun. 16, 2008, now abandoned.

(60) Provisional application No. 60/966,794, filed on Aug. 30, 2007.

(51) Int. Cl.
| | |
|---|---|
| *C03B 31/00* | (2006.01) |
| *C03B 33/00* | (2006.01) |
| *C03B 32/00* | (2006.01) |
| *C03B 37/00* | (2006.01) |
| *C03B 19/06* | (2006.01) |

(52) U.S. Cl. ............... 65/111; 65/32.5; 65/17.4; 501/54
(58) Field of Classification Search ............ 501/53, 501/54; 65/32.1, 32.5, 17.4, 157, 111
See application file for complete search history.

(56) References Cited

U.S. PATENT DOCUMENTS

| | | | |
|---|---|---|---|
| 6,619,073 B2 * | 9/2003 | Borrelli et al. ............... 65/30.1 |
| 2002/0061810 A1 | 5/2002 | Urano et al. | |
| 2007/0049482 A1 * | 3/2007 | Otsuka et al. .................. 501/54 |
| 2007/0105703 A1 | 5/2007 | Bookbinder et al. | |
| 2007/0105704 A1 | 5/2007 | Bookbinder et al. | |

OTHER PUBLICATIONS

My Hang V. Huynh and Thomas J. Meyer; "Colossal Kinetic Isotope Effects in Proton-Coupled Electron Transfer"; Proceedings of the National Academy of Sciences, vol. 101 (2004) 13138-13141.
My Hang V. Huynh and Thomas J. Meyer; "Colossal Kinetic Isotope Effects in Proton-Coupled Electron Transfer"; Proceedings of the National Academy of Sciences, vol. 101 (2004) 13138-13141.

\* cited by examiner

*Primary Examiner* — Jerry Lorengo
*Assistant Examiner* — Noah Wiese
(74) *Attorney, Agent, or Firm* — Robert P. Santandrea

(57) ABSTRACT

A method of making a fused silica article having a combined concentration of protium and deuterium in a range from about $1\times10^{16}$ molecules/cm$^3$ up to about $6\times10^{19}$ molecules/cm$^3$. In some embodiments, deuterium is present in an amount greater than its natural isotopic abundance. The method includes the steps of providing a fused silica boule, diffusing at least one of protium and deuterium into the boule, and annealing the boule to form the fused silica article. A method of diffusing hydrogen into fused silica and a fused silica article loaded with hydrogen formed by the method are also described.

8 Claims, 5 Drawing Sheets

FUSED SILICA ARTICLE LOADED WITH DEUTERIUM AND METHOD OF MAKING

CROSS-REFERENCE TO RELATED APPLICATIONS

This application is a divisional of and claims the benefit of priority from U.S. patent application Ser. No. 12/139,853, filed on Jun. 16, 2008 now abandoned, which claims the benefit of priority under 35 U.S.C. §119(e) of U.S. Provisional Application Ser. No. 60/966,794 filed on Aug. 30, 2007, the contents of which is relied upon and incorporated herein by reference in its entirety.

BACKGROUND

The invention relates to fused silica. More particularly, the invention relates to a method of loading fused silica with hydrogen.

Molecular hydrogen is desirable in fused silica lenses used in photolithography because it mitigates color center formation caused by excimer laser radiation. Fused silica made by the soot-to-glass process does not contain molecular hydrogen, and therefore requires that hydrogen be loaded into the fused silica after sintering/consolidation.

Hydrogen easily diffuses into fused silica. However, at low temperatures, loading times are inconveniently long. At higher temperatures, hydrogen reacts with the silica lattice to form silicon hydride (SiH*) at unacceptably high concentrations. The presence of SiH* is undesirable, as it decreases initial transmission, transient absorption, increases fluence, and may contribute to laser induced wavefront distortion. The degree of reaction of silicon with hydrogen depends upon loading time and temperature, as well as the composition of the fused silica.

SUMMARY

The present invention provides a method of making a fused silica article having a concentration of hydroxyl (OH) groups of up to about 60 parts per million (ppm) by weight and a combined concentration of protium and deuterium in a range from about $1 \times 10^{16}$ molecules/cm$^3$ up to about $6 \times 10^{19}$ molecules/cm$^3$, where deuterium is present in a concentration that is greater than its natural isotopic abundance. In one embodiment, the article is formed by providing a fused silica boule comprising up to about 60 ppm OH by weight, diffusing deuterium into the boule, and annealing the boule to form the fused silica article. A method of diffusing hydrogen into fused silica is also described.

Accordingly, one aspect of the invention is to provide a fused silica article. The fused silica article has a combined concentration of protium and deuterium in a range from about $1 \times 10^{16}$ molecules/cm$^3$ up to about $6 \times 10^{19}$ molecules/cm$^3$ and a concentration of hydroxyl groups of less than about 100 ppm by weight, wherein deuterium is present in an amount that is greater than its natural isotopic abundance.

A second aspect of the invention is to provide a fused silica article. The fused silica article is formed by: providing a fused silica boule, wherein the fused silica boule has been consolidated, and wherein the fused silica boule has a concentration of hydroxyl groups of less than about 100 ppm by weight; diffusing deuterium into the fused silica boule at a predetermined temperature, wherein the deuterium is present in an amount that is greater than its natural isotopic abundance; and annealing the fused silica boule after diffusing the deuterium at a predetermined annealing temperature into the fused silica boule to form the fused silica article, wherein the fused silica article has a combined concentration of protium and deuterium in a range from about $1 \times 10^{16}$ molecules/cm$^3$ up to about $6 \times 10^{19}$ molecules/cm$^3$, and wherein deuterium is present in a concentration that is greater than its natural isotopic abundance.

A third aspect of the invention is to provide a method of making a fused silica article. The method comprises the steps of: providing a fused silica boule, wherein the fused silica boule has been consolidated, and wherein the fused silica boule has a concentration of hydroxyl groups of less than about 100 ppm by weight; diffusing the deuterium into the fused silica boule at a predetermined temperature, wherein the deuterium is present in an amount that is greater than its natural isotopic abundance; and annealing the fused silica boule after diffusing the deuterium into the fused silica boule at a predetermined annealing temperature to form the fused silica article, wherein the fused silica article has a combined concentration of protium and deuterium in a range from about $1 \times 10^{16}$ molecules/cm$^3$ up to about $6 \times 10^{19}$ molecules/cm$^3$, and wherein deuterium is present in a concentration that is greater than its natural isotopic abundance.

A fourth aspect of the invention is to provide making a fused silica article. The method comprises the steps of: providing a fused silica boule, wherein the fused silica boule has been consolidated, and wherein the fused silica boule has a concentration of hydroxyl groups of less than about 100 ppm by weight; exposing the fused silica boule to at least one pulse of a first deuterium pressure, wherein each pulse has a predetermined duration time, and wherein the deuterium pressure is greater than ambient pressure; exposing the fused silica boule to a second deuterium pressure immediately after each pulse for a second duration time, wherein the second deuterium pressure is less than the first deuterium pressure; and annealing the fused silica boule after diffusing the deuterium at a predetermined annealing temperature to form the fused silica article, wherein the fused silica article has a combined concentration of protium and deuterium in a range from about $1 \times 10^{16}$ molecules/cm$^3$ up to about $6 \times 10^{19}$ molecules/cm$^3$, and wherein deuterium is present in the fused silica article in a concentration that is great than its natural isotopic abundance.

A fifth aspect of the invention is to provide a method of diffusing deuterium into a fused silica boule. The method comprises the steps of: providing a fused silica boule, wherein the fused silica boule has been consolidated; exposing the fused silica boule to at least one pulse of a first deuterium pressure, wherein each pulse has a predetermined duration time, and wherein the deuterium pressure is greater than ambient pressure; and exposing the fused silica boule to a second deuterium pressure immediately after each pulse for a second duration time, wherein the second deuterium pressure is less than the first deuterium pressure.

These and other aspects, advantages, and salient features of the present invention will become apparent from the following detailed description, the accompanying drawings, and the appended claims.

BRIEF DESCRIPTION OF THE DRAWINGS

FIG. 3 is a plot of calculated hydrogen profiles based on the loading schedule shown in FIG. 2a.

DETAILED DESCRIPTION

Figure 1:
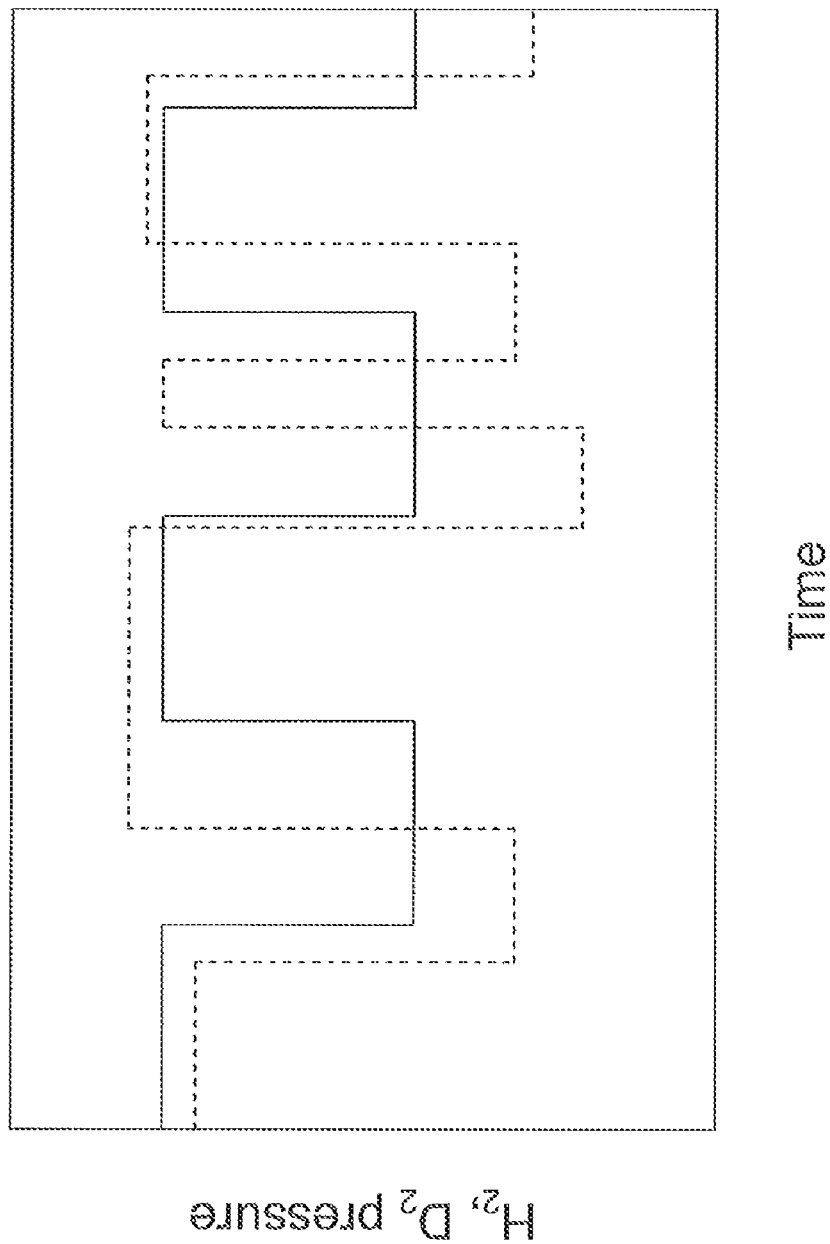
FIG. 1 is a plot of possible pulsing schedules for the pulsed hydrogen loading of a fused silica boule.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values includes both the upper and lower limits of the range.

Referring to the drawings in general and to FIG. 1 in particular, it will be understood that the illustrations are for the purpose of describing a particular embodiment of the invention and are not intended to limit the invention thereto.

As used herein, "protium" refers to the hydrogen isotope having a mass number of 1 and consisting of a single proton and electron. The symbols "H" and "$H_2$" refer to protium ($_1^1H$) atoms and molecules, respectively, unless otherwise specified. As used herein, the terms n(H) and n($H_2$) refer to the total number of protium atoms and molecules, respectively, in a material.

As used herein, "deuterium" refers to the hydrogen isotope having one proton and one neutron in its nucleus, and having an atomic weight of 2.0144. The symbols "D" and "$D_2$" refer to deuterium ($_1^2H$) atoms and molecules, respectively, unless otherwise specified. As used herein, the terms n(D) and n($D_2$) refer to the total number of deuterium atoms and molecules, respectively, in a material.

As used herein, the term "hydroxyl(s)" or OH means a moiety or a group of moieties, each consisting of an oxygen atom and a protium atom ($_1^1H$, referred to herein as "H"), unless otherwise stated. The oxygen atom may be any of the naturally occurring isotopes of oxygen ($^{16}O$, $^{17}O$, or $^{18}O$), or mixtures thereof, at any proportion. As used herein, n(OH) means the total number of OH moieties in a material.

As used herein, the term "hydrogen species" refers to any combination of the naturally occurring isotopes of hydrogen such as, for example, the naturally occurring mixture of protium and deuterium, any other mixture of protium and deuterium atoms and/or molecules, pure protium atoms and/or molecules, and pure deuterium atoms and/or molecules, unless otherwise stated.

As used herein, "hydrogen" refers to the naturally occurring mixture of protium and deuterium molecules and atoms (99.98% protium and 0.02% deuterium), unless otherwise stated.

The presence of molecular hydrogen, comprising at least one of protium and deuterium, in high purity fused silica is advantageous because it mitigates color center formation caused by extensive excimer laser irradiation (e.g., 193 nm ArF laser at fluences ranging from 0-900 μJ/cm²). High purity fused silica made by the soot-to-glass process, however, does not contain molecular hydrogen, and thus requires a post-consolidation loading step to achieve the desired $H_2$ levels, which are in the range from about $1×10^{16}$ molecules/cm³ up to about $6×10^{19}$ molecules/cm³, and, in one embodiment, from about $0.1×10^{17}$ molecules/cm³ up to about to $1.0×10^{17}$ molecules/cm³. Although the isotopes of hydrogen can be readily diffused into fused silica glass, a number of practical issues, including long loading times at temperatures less than 500° C. and increased concentrations of silicon hydride (SiH*) or silicon deuteride (SiD*) at loading temperatures greater than 700° C. limit the loading process. SiH* is formed by the thermal reaction of $H_2$ with the lattice structure:

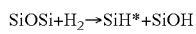

SiOSi+$H_2$→SiH*+SiOH

Silicon deuteride (SiD*) is formed by an analogous reaction:

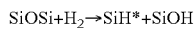

SiOSi+$H_2$→SiH*+SiOH

This general reaction is highly dependent on the glass composition, loading time, and loading temperature. In particular, neither nor SiD* is desired for 193 nm ArF optics. The presence of either SiH* or SiD* leads to degradation of the fused silica, causing decreased transmission, transient absorption, increased fluence dependent transmission (FDT), and laser induced wave front distortion (LIWFD). It is therefore desirable to provide the fused silica optical component with the proper hydrogen concentration and to select loading times and temperatures to obtain the most desirable attributes in high purity fused silica optical components while minimizing the formation of SiH* and/or SiD*.

Due to its lower absorptivity, the use of deuterium as a dopant in fused silica may be more efficient at mitigating laser damage issues than the naturally occurring mixture of hydrogen isotopes, which comprises about 99.98% protium and 0.002% deuterium. The formation of SiD or SiOD upon thermal or photolytic reaction with silica is advantageous as compared to SiH or SiOH due to reduced chemical reaction rates. By loading fused silica with $D_2$ instead of $H_2$, improvements in vacuum ultra violet (VUV) transmission and laser durability may be realized. In addition, mixtures of $D_2$ and $H_2$ loading may be utilized as well to provide a lower cost alternative, while still providing improved laser damage for a fused silica article.

A fused silica article such as, but not limited to, lenses that are capable of operating in the ultraviolet region of the spectrum, and a method of making the fused silica article is provided. The fused silica article has concentration of hydroxyl (OH) groups of less than about 60 ppm, and a mean combined concentration of protium and deuterium molecules in a range from about $1×10^{16}$ molecules/cm³ up to about $6×10^{19}$ molecules/cm³ and, in one embodiment, in a range from about $0.1×10^{17}$ molecules/cm³ up to about $1×10^{17}$ molecules/cm³, where deuterium is present in an amount that is greater than its natural isotopic abundance. As used herein, the terms "total concentration" and "combined concentration" refer to the sum of the concentrations of $H_2$ (n($H_2$)), HD (n(HD)), and $D_2$ (n($D_2$))—i.e., combined concentration=n($H_2$)+n(HD)+n($D_2$). Deuterium is present in an amount that is greater than the natural isotopic abundance of deuterium; i.e., the ratio of n(D)/(n(H)+n(D)) in the material is greater than $2×10^4$. In one embodiment, deuterium comprises at least 10% of the total concentration of hydrogen species. In one particular embodiment, deuterium is the only hydrogen isotope or species that is present.

The fused silica article is made by first providing a fused silica boule that has been consolidated or sintered. As used herein, a boule refers to any piece of fused silica that may ultimately be formed or worked into the fused silica article. The fused silica boule may be formed by first forming a soot blank. Methods of forming soot blanks for fused silica articles are well known in the art. The soot blank—or preform—may be provided, for example, using a deposition method in which a gas stream containing a silicon-containing compound in vapor form is produced. The gas stream containing the silicon-containing compound is passed into the flame of a combustion burner to form amorphous particles of fused silica soot. The fused silica particles are deposited onto a support to form the fused silica soot blank. The support may be a supporting core cane or a mandrel, such as those in a typical outside vapor deposition (OVD), planar soot deposition (PSD), or a vapor axial deposition (VAD) process. If a mandrel is used, the mandrel may be removed after deposition to yield a hollow, cylindrically-shaped, porous soot body.

The soot particles are typically provided by flame hydrolysis of at least one silicon precursor compound. Silicon precursor compounds include, but are not limited to, halogen-containing compounds such as $SiCl_4$, $SiBr_4$, $SiF_4$, and the like. Silicon precursor compounds also include, but are not limited to, halide-free cyclosiloxane compounds such as, for example, polymethylsiloxanes. Such polymethylsiloxanes include hexamethyldisiloxane, polymethylcyclosiloxane, octamethylcyclotetrasiloxane (OMCTS), decamethylcyclopentasiloxane, hexamethylcyclotrisiloxane, and combinations thereof. Flame hydrolysis using hydrogen (or deuterium)-containing fuels (such as, for example, molecular hydrogen, hydrocarbons, and the like), precursors such as those named above, or both, typically contain OH (and OD) and water.

The soot blank is then sintered or consolidated by heating to a temperature of up to about 1500° C. to form the fused silica boule. Prior to consolidation, excess water, OH and OD may be optionally removed from the fused silica blank by means of a drying step, followed by oxidation. After such drying, OH is present in a concentration of less than about 60 parts per million (ppm) by weight. The fused silica boule may then be reformed or reshaped into a near net shape that approximates that of the final fused silica product such as, for example, a lens blank. The fused silica boule is reformed or reshaped using techniques that are known in the art such as, but not limited to, rolling out, squashing, tilt flow, and combinations thereof.

Following consolidation, deuterium and, optionally, protium are diffused into the reformed silica boule. The diffusion step is typically carried out by heating the consolidated fused silica boule in an atmosphere comprising deuterium, protium (optionally), and an inert gas such as, but not limited to, nitrogen, helium, argon, and the like. The diffusion step is carried out at a predetermined temperature for a predetermined time. In one embodiment, the predetermined temperature is in a range from about 350° C. up to about 700° C. and, in one particular embodiment, the predetermined temperature is in a range from about 400° C. up to about 500° C. The predetermined time is in a range from about 10 hours up to about 2500 hours. In one embodiment, the diffusion step comprises heating a fused silica boule at a temperature in a range from about 400° C. up to about 500° C. in an atmosphere comprising nitrogen and from about 90% up to about 100% hydrogen species, where deuterium is present in an amount that is greater than its natural isotopic abundance (i.e.; $n(D)/(n(H)+n(D))>2\times10^{-4}$). In one particular embodiment, the diffusion step comprises heating a fused silica boule at a temperature in a range from about 400° C. up to about 500° C. in an atmosphere comprising nitrogen and about 4% of deuterium and, optionally, protium.

After deuterium and, optionally, protium have been allowed to diffuse into the reformed fused silica boule, the bottle is annealed at a predetermined annealing temperature in a range from about 900° C. up to about 1200° C. The annealing step is typically carried out in air (i.e., the ambient atmosphere) or a nitrogen atmosphere. Following the annealing step, the silica boule is finished to the final shape of the fused silica article.

The diffusion step typically includes exposing the fused silica boule to an atmosphere having a combined concentration of protium and deuterium in a range from about 1 up to about 100%. In those instances where the atmosphere does not consist solely of hydrogen species, the atmosphere also comprises an inert gas such as nitrogen, helium, argon, or the like. In one embodiment, the atmosphere is approximately equal to or near ambient pressure (1 atm or 1.01 bar). The hydrogen species (i.e., deuterium and, optionally, protium) are allowed to diffuse into the fused silica boule to the point where a substantially uniform distribution of the hydrogen species is achieved throughout the boule. Under these conditions, the diffusion step is carried out over a period of several weeks in order to obtain an acceptable level of homogeneity of hydrogen species the boule.

In another embodiment, the diffusion step comprises exposing the fused silica boule at the predetermined temperature to a pressure of deuterium and, optionally, protium that is greater than atmospheric pressure, and is in a range from about 1 atm up to about 150 atm. The greater than atmospheric pressure "loads" the outer regions of the fused silica with the hydrogen species. This method of loading creates a concentration gradient across the body of the fused silica boule, with the exterior or peripheral regions of the boule having a higher concentration of hydrogen species than the central or interior portion of the boule. Continued heating at the predetermined temperature allows the hydrogen species to migrate to those regions of lower concentration until the concentration of hydrogen species throughout the fused silicon boule is substantially homogenous.

In one embodiment, the pressure of the hydrogen species is pulsed—i.e., the pressure is maintained at a higher than ambient value for a predetermined duration time—to load a region of the fused silica boule with a desired combined concentration of deuterium, or alternatively, with a desired concentration of deuterium and protium. The duration time of each individual pulse is in a range from about 5 up to about 120 minutes. After each such pulse, the pressure of the hydrogen species is immediately reduced to a lower pressure and maintained at that lower pressure for a second predetermined duration time. The fused silica boule, in one embodiment, is held at a predetermined temperature while the pressure is pulsed and then reduced. Examples of different possible schedules for the pulsing of pressure are schematically shown in FIG. 1. In one schedule, the pressure of the hydrogen species is pulsed or varied regularly (solid line in FIG. 1), with the fused silica boule being exposed to the same deuterium and protium (optionally) pressure for each pulse. Likewise, the duration of the pulses is the same, as are the intervals between successive pulses. Alternatively, the magnitude and duration of the pulses, as well as the intervals between successive pulses, may be varied (dashed line in FIG. 1).

The pressure may be pulsed multiple times over a predetermined time to achieve the desired concentration of hydrogen species within—and throughout—the fused silica article. This predetermined time may range from about 10 hours up to about 1000 hours. In one embodiment, the combined concentration of deuterium—and, optionally, protium—within the fused silica article is in a range from about $1\times10^{16}$ molecules/$cm^3$ up to about $6\times10^{19}$ molecules/$cm^3$ and, in another embodiment, in a range from about $0.1\times10^{17}$ molecules/$cm^3$ up to about $1\times10^{17}$ molecules/$cm^3$. The pressure of the hydrogen species is reduced once the desired loading is achieved. The hydrogen species migrate from the loaded region of the fused silica boule to those regions of the boule having lower concentrations of the hydrogen species, thus providing a substantially homogeneous loading of the desired hydrogen species throughout the fused silica boule.

A fused silica article may be, for example, an optical component of a photolithograpy system, an optical fiber, or the like. The fused silica article is capable of being used in a light path of photolithographic devices operating at wavelengths of less than 300 nm.

The following predictive example illustrates the features and advantages of the invention, and is in no way intended to limit the invention thereto. While the example describes the diffusion of hydrogen (i.e., the naturally occurring mixture of protium and deuterium molecules and atoms), it is expected that the model would produce similar results for deuterium alone.

Figure 2A:
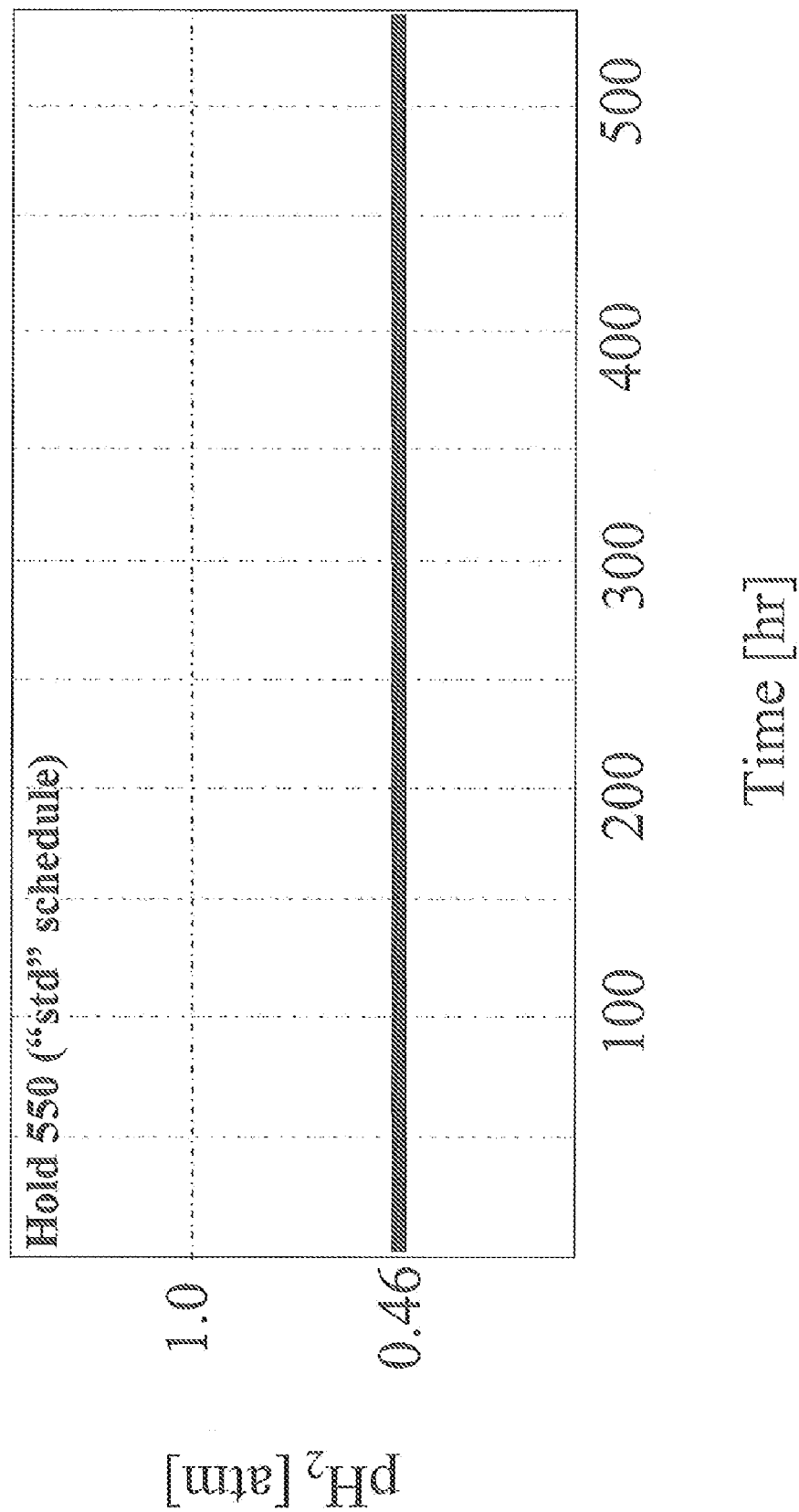
FIG. 2a is a plot of a hydrogen loading schedule for a silica sample in which the hydrogen pressure is maintained at 0.46 atm for 550 hours.
Figure 2B:
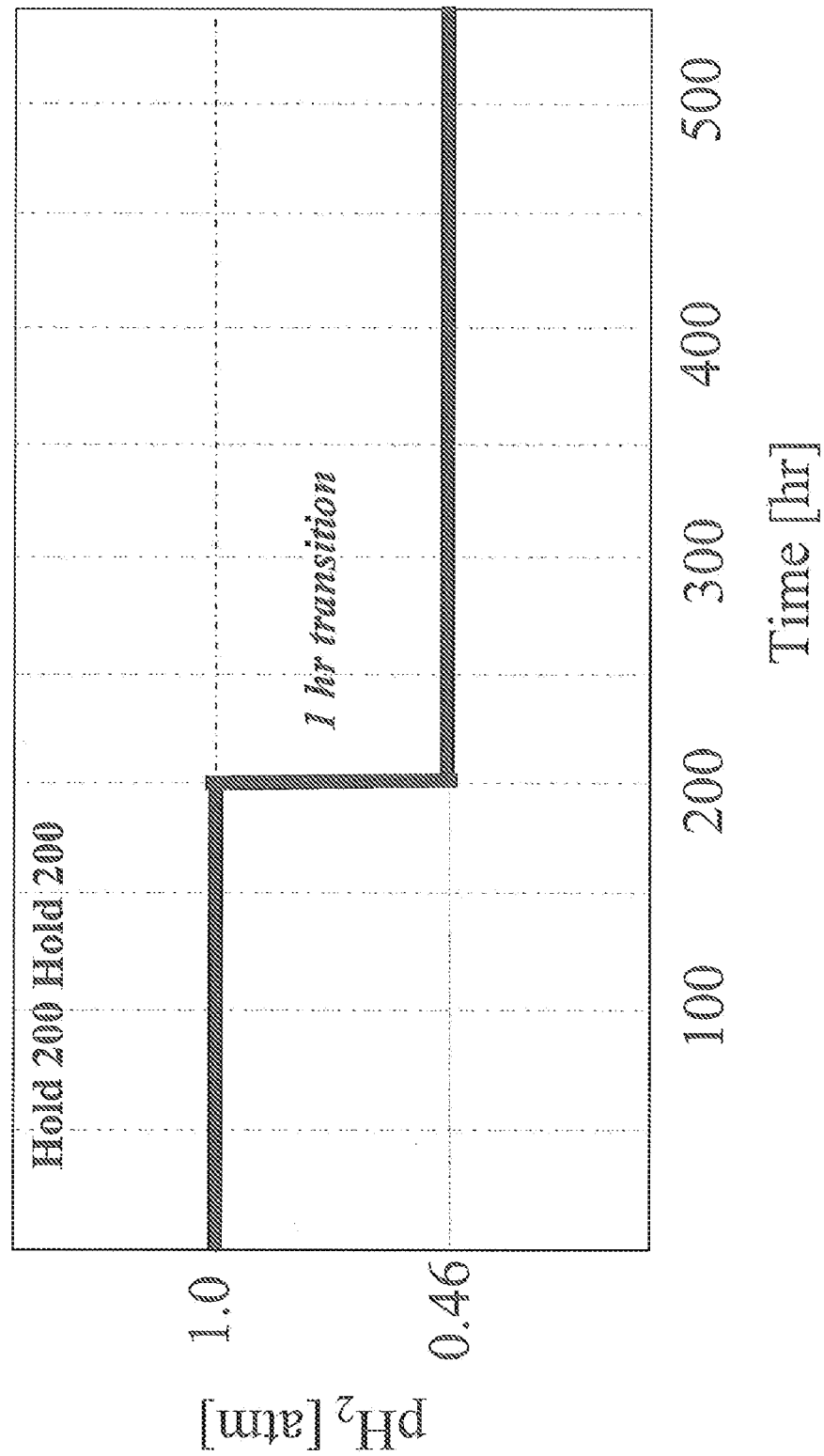
FIG. 2b is a plot of a hydrogen loading schedule for a silica sample in which the hydrogen pressure is pulsed at 1 atm for 200 hours, followed by maintaining the hydrogen pressure at 0.46 atm for 200 hours.

A hydrogen diffusion and reaction model can be used to generate a one dimensional analysis of hydrogen loading of a 40 mm thick silica sample at 475° C. The analysis assumes an initial OH concentration of 75 parts per million (ppm). In this example, "hydrogen" and "OH" refer to hydrogen and hydroxyl groups having the naturally occurring isotopic abundances of protium and deuterium. In one calculation, the hydrogen pressure is held constant at 0.46 atm—which is the pressure that has been determined to be needed to achieve a $H_2$ concentration of $1\times10^{17}$ molecules/$cm^3$ at the surface of the silica at 475° C. (FIG. 2a)—for 500 hours. In a second calculation, the hydrogen pressure is "pulsed"—i.e., held at 1 atm for 200 hours, reduced to 0.46 atm over a one hour transition period, and held at 0.46 atm for 200 hours (FIG. 2b).

Figure 3:
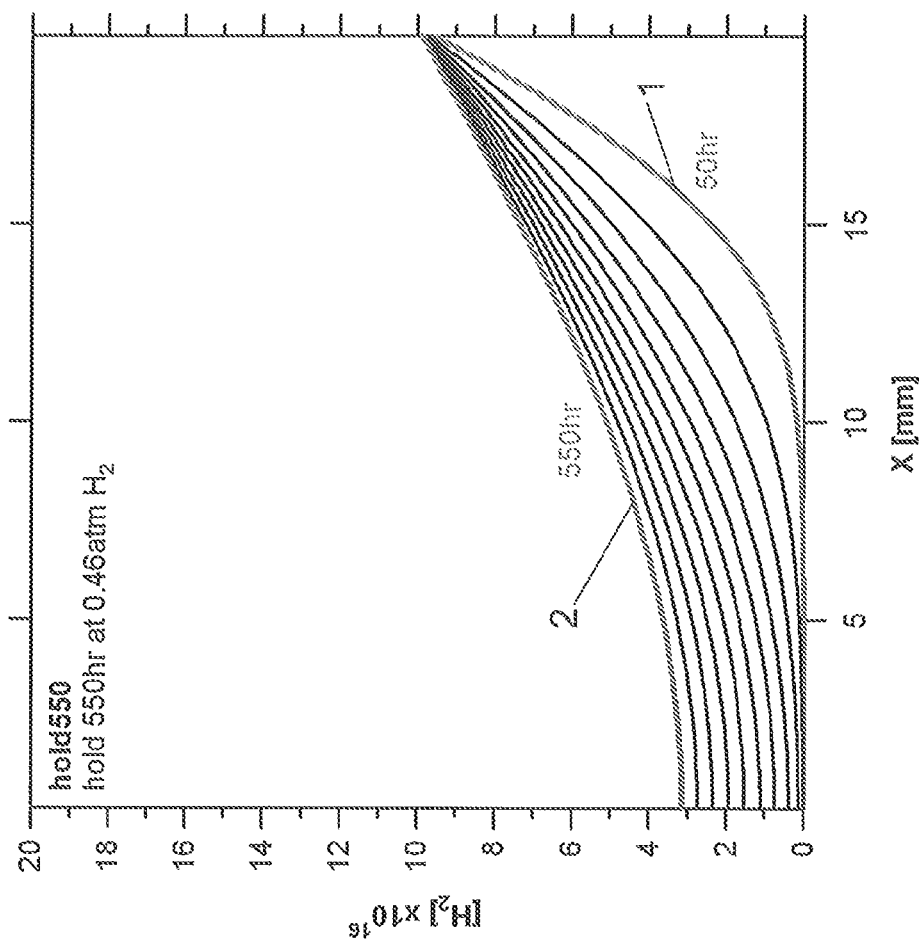
Figure 4:
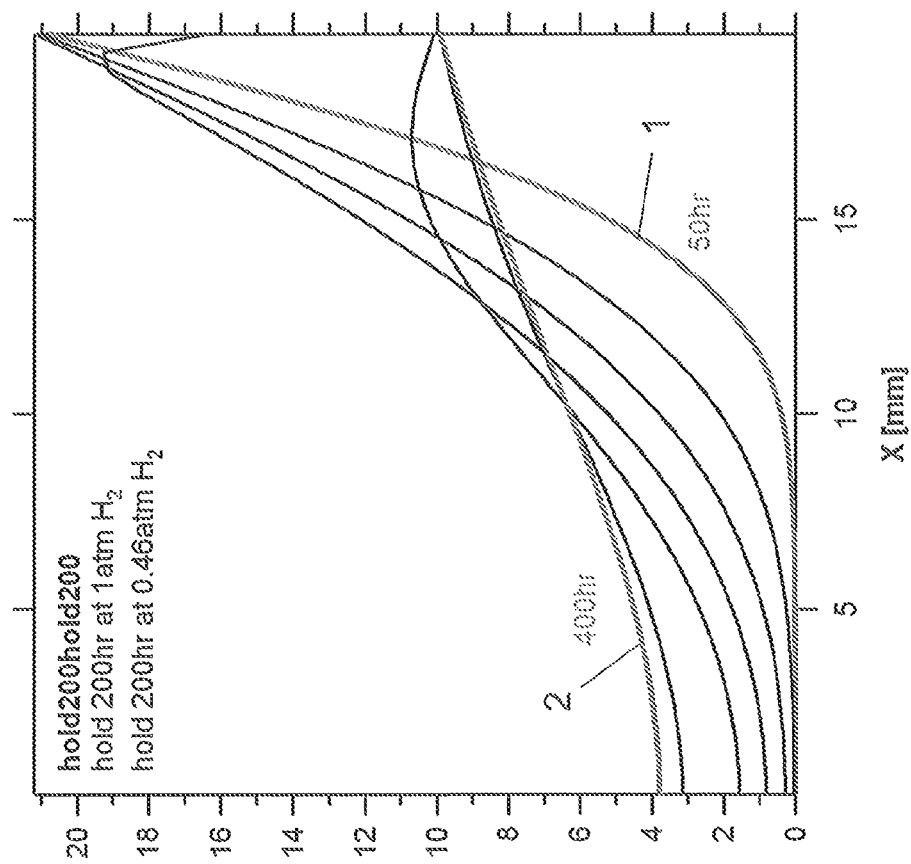
FIG. 4 is a plot of calculated hydrogen profiles based on the loading schedule shown in FIG. 2b.

The development of the hydrogen concentration profiles calculated in each instance is shown in FIGS. 3 and 4. Profiles are plotted at 50 hour intervals. In the case in which the hydrogen pressure is held constant at 0.46 atm for 550 hours (FIG. 3), the initial calculated hydrogen profile (1) ranges from about $9\text{-}10\times10^{17}$ molecules/$cm^3$ at the outer edge of the sample (20 mm) to 0 at a position about 9 mm distant from the center of the sample. The calculated hydrogen profile after 550 hours (2) ranges from about $9\text{-}10\times10^{17}$ molecules/$cm^3$ at the outer edge of the sample to about $3\times10^{17}$ molecules/$cm^3$ at the center of the sample.

In the case where the hydrogen pressure is pulsed (FIG. 4), the initial calculated hydrogen profile (1) ranges from about $21\times10^{17}$ molecules/$cm^3$ at the outer edge of the sample (20 mm) to 0 at a position about 8-9 mm distant from the center of the sample. The calculated hydrogen profile after 400 hours (2) ranges from about $10\times10^{17}$ molecules/$cm^3$ at the outer edge of the sample to almost $4\times10^{17}$ molecules/$cm^3$ at the center of the sample. Thus, the modeling results indicate that pulsing the hydrogen pressure to atmospheric pressure produces a hydrogen profile in a silica sample that is approximately the same as that obtained by exposing the sample to a lower hydrogen pressure for longer periods of time. In addition, pulsing the hydrogen pressure to atmospheric pressure reduces the loading time by more than 25%.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A method of making a fused silica article, the method comprising the steps of:
    a. providing a fused silica boule, wherein the fused silica boule has been consolidated, and wherein the fused silica boule has a concentration of hydroxyl groups of less than about 100 ppm by weight;
    b. diffusing the deuterium into the fused silica boule at a predetermined temperature by:
        i. exposing the fused silica boule to at least one pulse of a first deuterium pressure, wherein each pulse has a predetermined duration time and the first deuterium pressure is greater than ambient pressure; and
        ii. exposing the fused silica boule to a second deuterium pressure immediately after each pulse for a second duration time, wherein the second deuterium pressure is less than the first deuterium pressure,
    wherein steps (i) and (ii) are repeated for a predetermined time period, wherein the predetermined time period is sufficient to load a region of the fused silica boule with a combined concentration of protium and deuterium, and wherein the deuterium is present in an amount that is greater than its natural isotopic abundance; and
    c. annealing the fused silica boule after diffusing the deuterium into the fused silica boule at a predetermined annealing temperature to form the fused silica article, wherein the fused silica article has a combined concentration of protium and deuterium in a range from about $1\times10^{16}$ molecules/$cm^3$ up to about $6\times10^{19}$ molecules/$cm^3$, and wherein deuterium is present in a concentration that is greater than its natural isotopic abundance.

2. The method according to claim 1, wherein the first deuterium pressure is in a range from about 1 atm up to about 150 atm.

3. The method according to claim 1, wherein the step of diffusing deuterium into the fused silica boule comprises exposing the fused silica boule to an atmosphere having a combined concentration of protium and deuterium in a range from about 1% up to about 100%.

4. The method according to claim 3, wherein the atmosphere comprises nitrogen and about 4% deuterium.

5. The method according to claim 1, wherein deuterium comprises at least 10% of the combined concentration.

6. The method according to claim 1, wherein the predetermined temperature is in a range from about 350° C. up to about 700° C.

7. The method according to claim 6, wherein the predetermined temperature is in a range from about 400° C. up to about 500° C.

8. The method according to claim 1, wherein the combined concentration of protium and deuterium is in a range from about $0.1\times10^{17}$ molecules/$cm^3$ up to about $1\times10^{17}$ molecules/$cm^3$.

* * * * *